US005471479A

United States Patent [19]
McRoberts et al.

[11] Patent Number: 5,471,479
[45] Date of Patent: Nov. 28, 1995

[54] ARRANGEMENT FOR COLUMN SPARING OF MEMORY

[75] Inventors: Louis A. McRoberts, Scottsdale; Donald E. Borden, Mesa, both of Ariz.

[73] Assignee: Motorola, Inc., Schaumburg, Ill.

[21] Appl. No.: 266,418

[22] Filed: Jun. 27, 1994

Related U.S. Application Data

[63] Continuation of Ser. No. 925,149, Aug. 6, 1992, abandoned.
[51] Int. Cl.$^6$ ..................................................... G06F 11/00
[52] U.S. Cl. ..................... 371/10.3; 364/245; 364/245.2; 364/245.3; 364/254.2; 364/255
[58] Field of Search ................................. 371/10.3, 10.1, 371/10.2, 2.2, 7, 11.1, 21.1, 40.1, 40.2, 40.3, 40.4; 364/243.43, 245, 245.2, 245.3, 255, 957.8, 957.5, 961, 964.6, 964.7, 965.2, 970, 970.1; 395/425, 575, 400; 365/201

[56] References Cited

U.S. PATENT DOCUMENTS

| | | | |
|---|---|---|---|
| 4,075,466 | 2/1978 | Jonsson et al. | 371/21.1 |
| 4,197,580 | 4/1980 | Chang et al. | 395/425 |
| 4,389,715 | 6/1983 | Eaton, Jr. et al. | 371/10.3 |
| 4,459,685 | 7/1984 | Sud et al. | 371/11.1 |
| 4,463,450 | 7/1984 | Haeusele | 371/10.3 |
| 4,523,313 | 6/1985 | Nibby, Jr. et al. | 371/10.1 |
| 4,604,730 | 8/1986 | Yoshida et al. | 371/10.3 |
| 4,648,075 | 3/1987 | Segawa et al. | 371/10.2 |
| 4,672,581 | 6/1987 | Waller | 371/10.2 |
| 5,163,023 | 11/1992 | Ferris et al. | 371/10.3 |
| 5,195,057 | 3/1993 | Kasa et al. | 371/10.3 |

Primary Examiner—Robert W. Beausoliel, Jr.
Assistant Examiner—Dieu-Minh Le
Attorney, Agent, or Firm—Frank J. Bogacz

[57] ABSTRACT

An arrangement for automatic replacement of faulty memory elements in a M-row by N-column memory array provides increased memory reliability. The memory array is coupled to a computer by a group of transceivers. Replacement memory elements are provided in a column replacement fashion and are selectively enabled on a row-by-row basis for detected faults within the memory elements of the memory array. Transceivers are appropriately enabled to select one of two memory elements for each column. For a detected fault in a memory element, each memory element is shifted to an adjacent memory element and the replacement memory element is employed to substituted for the last regular memory element.

8 Claims, 5 Drawing Sheets

ARRANGEMENT FOR COLUMN SPARING OF MEMORY

This application is a continuation of prior application Ser. No. 07/925,149, filed Aug. 6, 1992, now abandoned.

BACKGROUND OF THE INVENTION

The present invention pertains to reliable computer memory arrangement and more particularly to an arrangement for column sparing of memory units.

Memory reliability is a critical issue in many computer systems and is of particular importance in computer systems designed for space applications. To achieve reliability, redundancy (memory sparing) is employed. Redundancy of memory may be achieved by duplicating memory completely or by adding additional rows or columns of memory to the basic minimum memory required by the system.

Typical computer memory is implemented in semiconductor chips having a particular storage capacity and organization. One such memory organization may be a chip having a 128K (K=1024) by 8-bit memory words. When a particular word of this memory is addressed, 8 bits are read from the memory or written to the memory at the appropriate address. Each memory word is 8 bits in width. Larger memories may be formed by including more memory chips in rows and columns. That is, if a 32-bit wide memory word is desired, the memory may include a row of four such memory chips, each memory chip providing 8 bits of data in or out. When each of these four memory chips is simultaneous enabled and the appropriate address entered, a memory word 32 bits in width is produced at the output of these four memory chips. To provide a greater number of memory words for the computer system, additional rows of memory may be included. Each memory row would produce a 32-bit data word, for example.

For reliability using a redundant approach, another row of memory may be provided. That is, a number of memory chips would have to be added equal to the width of the basic computer memory word of the system. In the above example, for a 32-bit word, a row of four memory chips would be added. When the computer fault detection mechanism detected a fault in one of the memory chips, the whole row of chips in which that memory fault resided would be disabled. The whole row of memory chips held as redundant spares would then be enabled to replace the faulty memory row. This is an inefficient scheme since for one memory chip failure many memory chips would be required to replace the entire row in which that failure occurred.

Column redundant memory is a more efficient arrangement. For column redundant memory, one memory chip for each row of memory is added in a column. The column of added memory chips each may serve as a replacement for a faulty memory chip with the stipulation that only one fault in each row is obtained. The benefit is that if a fault exists in one memory chip of four different rows, each of these memory chips may be replaced with a spare memory chip under the column sparing approach.

It is highly desirable to provide an efficient column sparing memory arrangement for a computer memory system which is easy to manufacture.

SUMMARY OF THE INVENTION

In accordance with the present invention, a novel memory replacement arrangement for a column memory replacement system is shown.

A memory replacement arrangement for a memory array of M-rows by N-columns which includes at least one column of replacement memory and the memory array is coupled to a computer via an address and a data bus. The memory replacement arrangement includes transceivers which are coupled between the computer and the memory array. The transceivers selectively couple the memory elements of the memory array to the computer via the data bus. Also included is an enabling apparatus which is coupled to the transceivers and to the computer via the address bus. For a faulty memory element in one of the M-rows of the memory array, the enabling apparatus selectively enables the transceivers to select memory elements from one of the M-rows and N–1 columns of the one row including one replacement memory element for transferring computer words into or out of the memory array.

DESCRIPTION OF THE PREFERRED EMBODIMENTS

Figure 1:
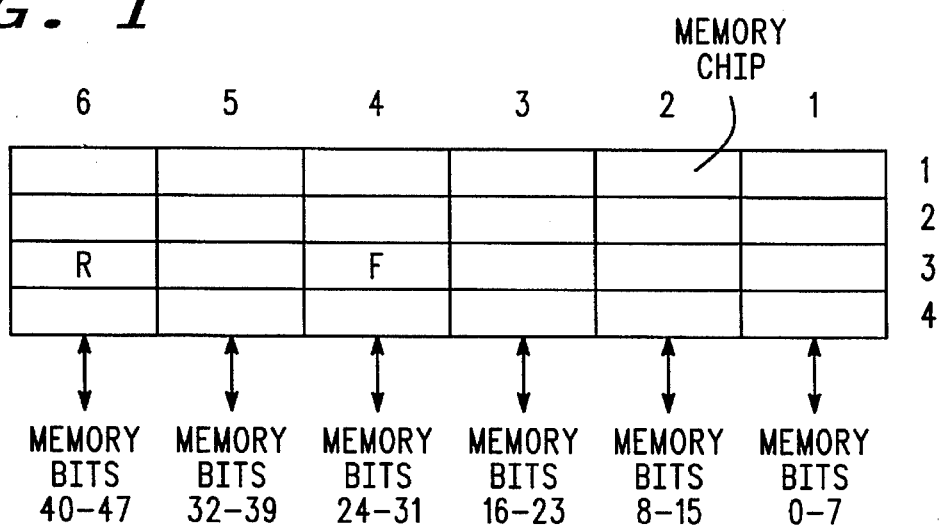
FIG. 1 is a layout of memory chips forming a column redundant computer memory.

FIG. 1 depicts a layout of memory chips comprising a computer memory. These chips are arranged in rows and columns. Each memory chip may be addressed by a row and column coordinate. That is, the top right-most memory chip is memory chip 1,1. Memory chip 3,4 shows a "F" indicating that chip is faulty. Memory chip 3,6 has a "R" indicating that this memory chip is a replacement for memory chip 3,4.

For purposes of explanation and as an example each of the memory chips depicted will be assumed to be 128K by 8 bits. The memory will be organized on a 32-bit basic memory word. That is, memory bits 0 through 31 provide for the data storage. Memory bits 32 through 39 are for error detection and correction purposes. Memory bits 40 through 47 are the column redundant memory chips for replacing failed memory chips. When an appropriate address and chip select (CS) are supplied to the memory array shown in FIG. 1, a 32-bit data output is produced (bits 0 through 31) and an 8-bit output (bits 32 through 39) is made for error detection and correction circuitry. Memory bits 40 through 47 are not placed upon the data bus until the appropriate selections are provided to column 6 as a result of failure of other of the memory chips. Column 6 is the column redundant memory for the present memory arrangement.

Since memory chip 3,4 of the memory matrix shown in FIG. 1 is indicated as being faulty by the letter "F" in the corresponding location of the matrix, it functionally, although not actually, will be replaced with memory chip 3,6. With row redundant memory organization, an entire row of memory must replace an entire row of memory even if only one memory chip in the row is faulty. As shown above with column redundant memory chips, one faulty memory chip in a given row may be replaced by only one memory chip. That is, faulty memory chip 3,4 may be functionally replaced by redundant memory chip 3,6 while memory chips 1,6; 2,6; and 4,6 may replace other faulty memory chips in their respective rows.

Figure 2:
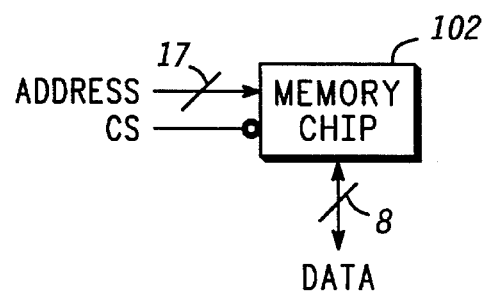
FIG. 2 is a schematic diagram of an individual memory chip depicting inputs and outputs.

FIG. 2 depicts a typical memory chip of the memory chip array shown in FIG. 1. Memory chip 100 is a 128K by 8-bit device for purposes of explanation of the present invention. Memory chip 100 has an address bus input. The address bus for a memory chip of 128K by 8-bits is a 17-bit address bus. Memory chip 100 also has a chip select (CS) input. When memory chip 100 is selected via the CS lead, and a 17-bit address supplied via the address bus, 8 data bits may be read from or written to memory chip 100. The control of reading and writing is accomplished by conventional read/write memory signal (shown infra). The memory chips shown throughout this application may be those shown in FIG. 2 as an example.

Figure 3:
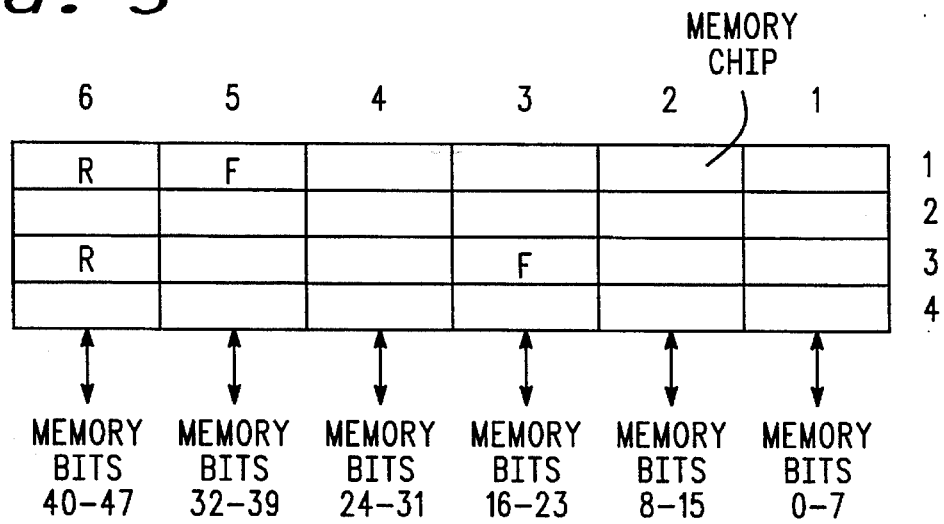
FIG. 3 is a layout of memory chips forming a computer memory and depicting a particular failure pattern.

FIG. 3 is a layout of a memory array similar to FIG. 1. FIG. 3 depicts faults in memory chips 1,5 and 3,3. Memory chip 3,3 will be functionally replaced by memory chip 3,6 and similarly, memory chip 1,5 will be functionally, although not actually, replaced by memory chip 1,6. The above is a functional explanation of the occurrences for the column redundant memory replacement. In implementation, each of the memory chip functions to the left of a faulty chip are shifted down by one. That is, the functionality of memory chip 3,3 is not actually replaced by memory chip 3,6. Memory chip 3,4 replaces memory chip 3,3. Memory chip 3,5 replaces the function of memory chip 3,4 and memory chip 3,6 replaces the function of memory chip 3,5. For the fault in memory chip 1,5, replacement is achieved by functionally replacing it with memory chip 1,6. The other memory chip assignments in row one remain unchanged.

Figure 4:
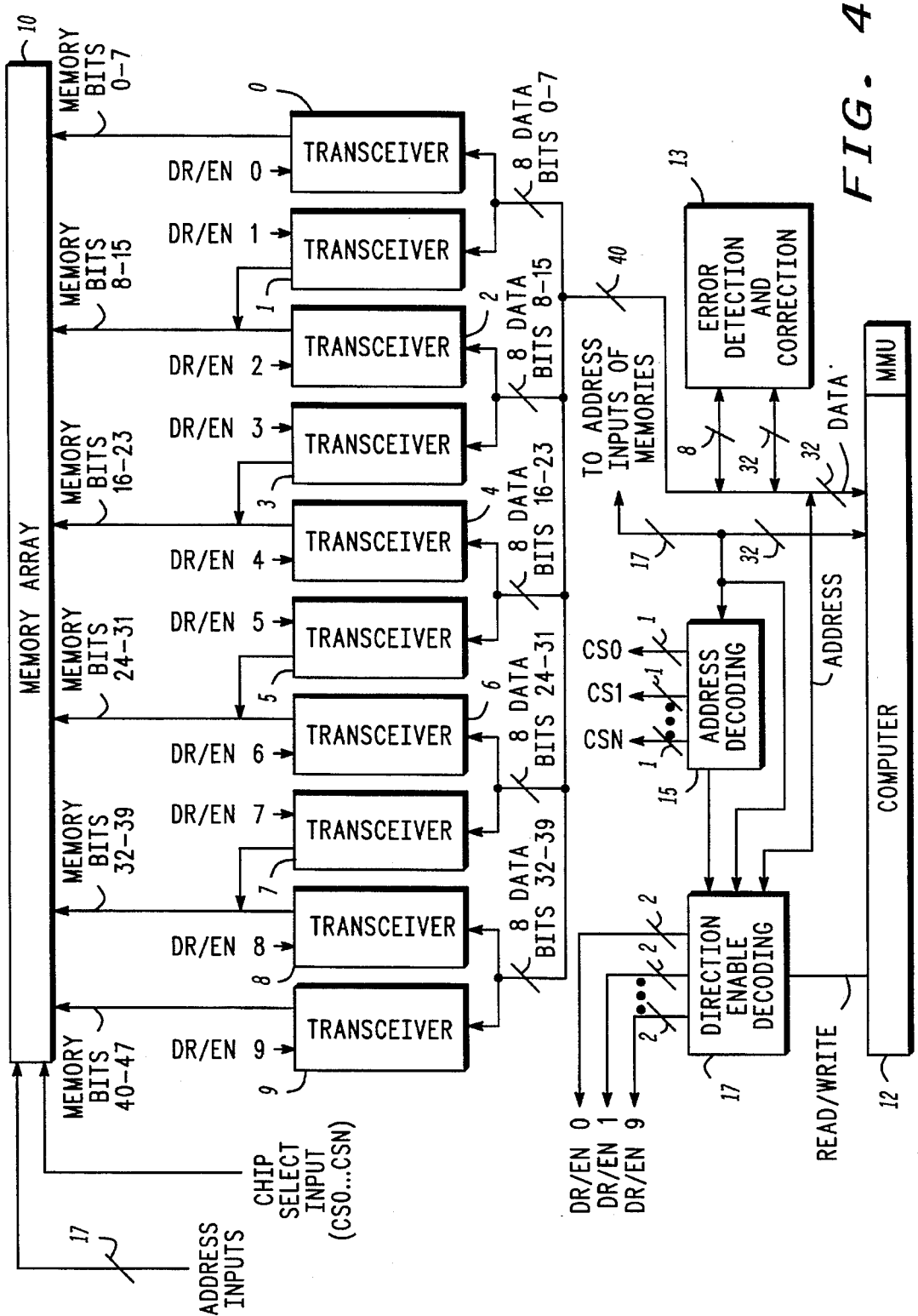
FIG. 4 is a schematic diagram of a computer memory system embodying the principals of operation of the present invention.

FIG. 4 is a schematic diagram of a computer memory system in accordance with the present invention. Computer 12 is coupled to memory array 10 via address and data busses. The read/write lead couples computer 12 to direction and enable decoding 17. Computer 12 is coupled to address decoding 15 and direction and enable decoding 17 via the address bus. Computer 12 is also coupled via the data bus to error detection and correction circuit 13. Address decoding 15 is coupled to memory array 10 via the chip select leads (CS0 . . . CSN). Computer 12 is coupled to transceivers 0 through 9 via the data bus. Transceivers 0 through 9 are coupled to memory array 10 and to the data bus. Direction and enable decoding 17 is coupled to each of the transceivers 0 through 9 via two leads. These two leads are the respective enable leads (EN) and the direction leads (DR). The direction lead (DR) indicates whether data is being written to or read from the memory array 10. The enable signals (EN) result from ANDing the chip select (CS0 through CSN) with the contents of registers within the direction and enable decoding 17. These registers and their contents will be explained infra.

Transceiver 1 is coupled to the common connection of transceiver 2 and memory column 2 of memory array 10 for the selective transmission of bits 0–7. Transceiver 3 is coupled to the common connection of transceiver 4 and memory column 3 of memory array 10 for the selective transmission of bits 8–15. Transceiver 5 is coupled to the common connection of transceiver 6 and memory column 4 of memory array 10 for the selective transmission of bits 16–23. Transceiver 7 is coupled to the common connection of transceiver 8 and memory column 5 of memory array 10 for the selective transmission of bits 24–31. Transceiver 9 is coupled to memory column 6 of memory array 10 for the selective transmission of bits 32–39.

The portion of the data bus including bit 0 through 7 is coupled to transceivers 0 and 1. The portion of the data bus including data bits 8 through 15 is coupled to transceivers 2 and 3. The portion of the data bus including bits 16 through 23 of the data bus are coupled to transceivers 4 and 5. The portion of the data bus including data bits 24 through 31 of the data bus are coupled to transceivers 6 and 7. The portion of the data bus including data bits 32 through 39 of the data bus are coupled to transceivers 8 and 9.

Transceivers 0 through 9 are coupled to memory array 10 and provide for transmission to or from the memory array 10 of data bits 0 through 47.

Figure 5:
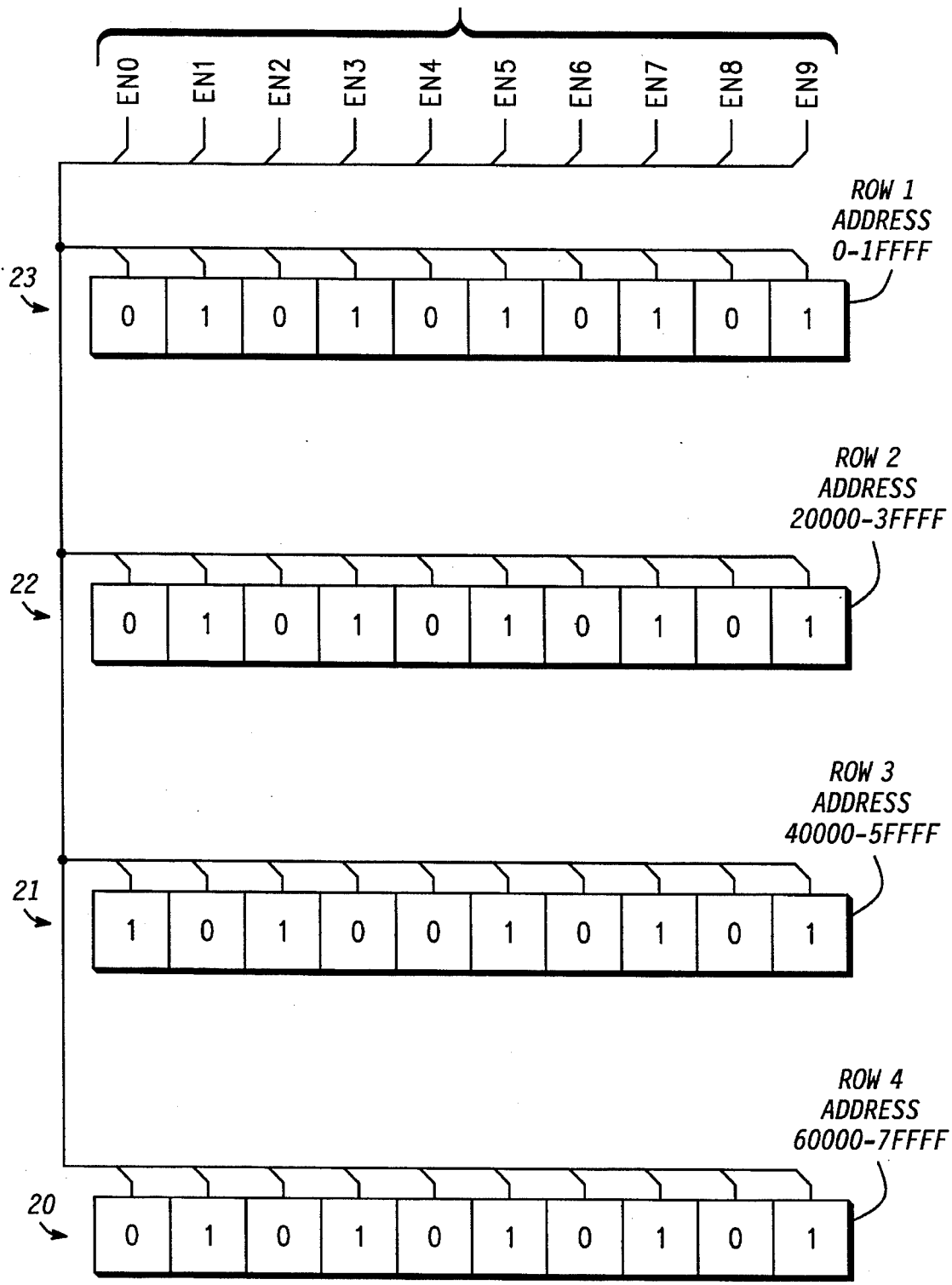
FIG. 5 is a block diagram of the direction and enable decoding device of FIG. 4 with memory failures shown in FIG. 1.

For the operation of the circuit shown in FIG. 4, let us consider an example of a memory write access. Computer 12 outputs the read/write signal to direction and enable decoding 17 to indicate that a write operation is taking place. Further, computer 12 outputs a 32-bit address. The least significant 17-bits are transmitted to the address inputs of the memory array 10. The most significant 15 address bits are transmitted to address decoding 15 and address decoding 15 generates the chip selects (CS) for each row of memory. Also n of the least significant bits are transmitted to direction and enable decoding 17 to access the internal registers in which the data patterns shown in FIG. 5 are stored. The exact number of bits transmitted to the direction and enable decoding depends on the memory size and the specific number of rows of memory chips (elements). For example, with four rows of memory chips two bits are required. Computer 12 further outputs its 32-bit data word on the data bus for transmission through transceivers 0 to 9 to memory array 10. Error detection and correction circuit 13 adds 8 additional bits to the 32-bit data bus for transmission to memory array 10 forming a 40-bit data word.

Assuming a memory array as depicted in FIG. 3, address decoding will produce four chip select CS0 through CS3. These chips selects will enable rows 1 through 4 respectively of memory array 10. Chip selects CS0 through CS3 will be input to memory array 10 as shown and one particularly row of the four will be enabled by one of the corresponding chip selects. The chip selects are transmitted from address decoding 15 to memory array 10.

The chip selects will select one of the four rows of memory as shown in FIG. 3. In response to the read/write signal received from computer 12, direction and enable decoding 17 will provide a direction signal (DR) which will indicate to memory 10 whether a read or write operation is to occur. In the present example, the DR lead will indicate that a write operation is to be performed to memory 10. Direction and enable decoding 17 outputs a 2-bit bus to each of the transceivers 0 through 9. This 2-bit bus includes the direction signal (DR) and a corresponding enable signal (EN0 through EN9). A unique enable signal EN0 through EN9 is transmitted to each of the corresponding transceivers 0 through 9.

In the present example since a write operation was specified by computer 12, the value of the DR lead will indicate that the direction of flow of data is from the data bus into memory array 10. A second logic value of the DR lead will indicate a read operation.

Direction and enable decoding 17 produces the appropriate enable signals for transceivers 0 through 9. Direction and enable decoding 17 includes a set of four registers as shown in FIG. 5. For the purposes of the succeeding explanation, FIG. 1 will be used as a reference with a fault shown in the memory chip position 3,4. Referring again to FIG. 5, four registers 20 through 23 are shown. Each register includes 10 bits of information for producing the enable signals EN0 through EN9 for row one of memory as shown in FIG. 3. Each register 20 through 23 corresponds to one of the memory rows depicted in FIG. 1. That is, register 23 includes the enable signal values for row one as shown in FIG. 1 including memory addresses 0 to 1FFFF (hexadecimal). Register 22 includes the enable signal values for row two of memory including addresses 20000 through 3FFFF. Register 21 includes the enable signal values for memory row three including addresses 40000 through 5FFFF. Register 20 includes the enable signal values for row four of memory including addresses 60000 through 7FFFF.

The enable signals EN0 through EN9 are read out of the appropriate word shown in FIG. 5 to address the proper row in memory depicted in FIG. 1. The enable signal values stored in the appropriate register are ANDed with the appropriate chip select for that row received from address decoding 15. The enable signals are then transmitted to the respective transceivers. That is, enable signal EN0 is transmitted to transceiver 0. Enable signal EN1 is transmitted to transceiver 1, etc. Direction and enable decoding 17 transmits a 2-bit bus comprising the direction signal DR and the enable signal EN to each of the transceivers 0 through 9. A logic "1" on the EN lead indicates that a transceiver is enabled and a logic "0" indicates that a transceiver is disabled.

As an example, if a memory location in row one is addressed, the status of the enable signal register 23 for row one includes enable signals EN0 through EN9 having the value of an alternating 1 and 0 (shown in FIG. 5) read from EN0 through EN9 (right to left). These signals are transmitted to the respective transceivers and as a result, transceivers 0, 2, 4, 6, and 8 are enabled. For example, we may consider transceivers 0 and 1 to be a pair, transceivers 2 and 3 to be a pair, etc. It is to be noted that the bit pattern of register 23 indicates that the enable signal values for the right hand transceiver of each pair have a logic "1" in the corresponding enable signal bit pattern and therefore the even numbered transceivers will be enabled (0, 2, 4, 6, and 8). This is the normal operating condition of the computer memory system.

Now considering the fault shown in memory chip 3,4 in FIG. 1, register 21 will include the enable signal values for this fault situation. The fault is in memory chip 3,4. That is, the fourth memory chip in row three. The objective is to functionally replace the faulty memory chip 3,4 with the replacement memory chip 3,6. Functionally, this replacement occurs, however, replacement is performed on a chip by chip basis for each memory chip to the left of the faulty memory chip. That is, memory chip 3,5 replaces faulty memory chip 3,4; and memory chip 3,6 replaces memory chip 3,5. If we examine the values of the enable signals for row three, register 21, we find that enable signals values for transceivers 0, 2, 4, 7, and 9 are set to logic "1". The transceivers corresponding to these enable signals (transceivers 0, 2, 6, 7, and 9) will be enabled. As a result, memory chip 3,1 via transceiver 0 will be enabled; memory chip 3,2 via transceiver 2 will be enabled; memory chip 3,3 via transceiver 4 will be enabled; memory chip 3,4 will be disabled; memory chip 3,5 will replace memory chip 3,4 via the cross-coupling of transceiver 7 to the memory chip 3,5 of memory array 10; and memory chip 3,6 via transceiver 9 will replace memory chip 3,5. As a result, the functional use of each one of the memory chips has been shifted from the faulty memory chip 3,4 one memory chip to the left in the matrix and the replacement memory chip 3,6 in row 3 is now used as part of memory array 10 to complete row 3 computer memory words.

When fault are detected, computer 12 keeps track of which memory chip is faulty. Computer 12 then writes enable signal values into the respective registers 20 through 23 in order to indicate which memory chips are to be used and enables via the corresponding transceiver the appropriate replacement memory. Computer 12 writes registers (20–23) as memory addresses. Certain memory addresses are dedicated to the registers 20 through 23. Transceivers 0 through 9 may be implemented with Part No. AC245 such as the kind manufactured by Motorola, Inc.

Figure 6:
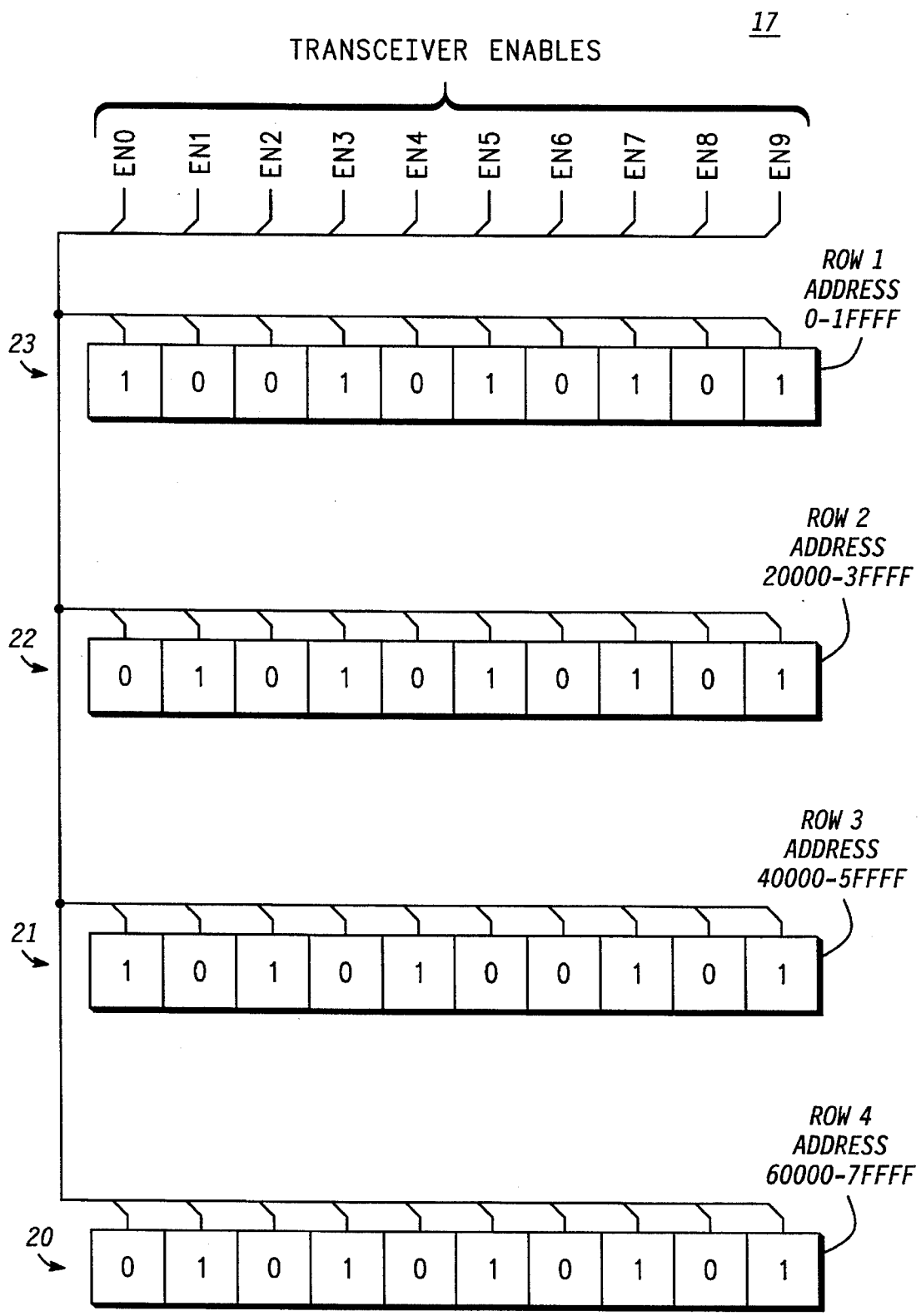
FIG. 6 is a block diagram of the direction and enable decode device of FIG. 4 having a particular failure pattern.

FIG. 6 depicts the register values for registers 20–23 for the fault condition shown by FIG. 3. Memory chips 1,5 and 3,3 are faulty. Replacement memory chips 1,6 and 3,6 will be employed in their respective rows to provide suitable replacement memory for memory chips 1,5 and 3,3. The transceiver enable values for this faulty condition are shown in FIG. 6, registers 23 and 21. For register 21 (memory row 1), transceivers 0, 2, 4, 6, and 9 will be enabled, thereby forming as appropriate memory word for row 1. For register 23 (memory row 1), transceivers 0, 2, 5, 7, and 9 will be enabled, thereby forming as appropriate memory word for row 3.

Figure 7:
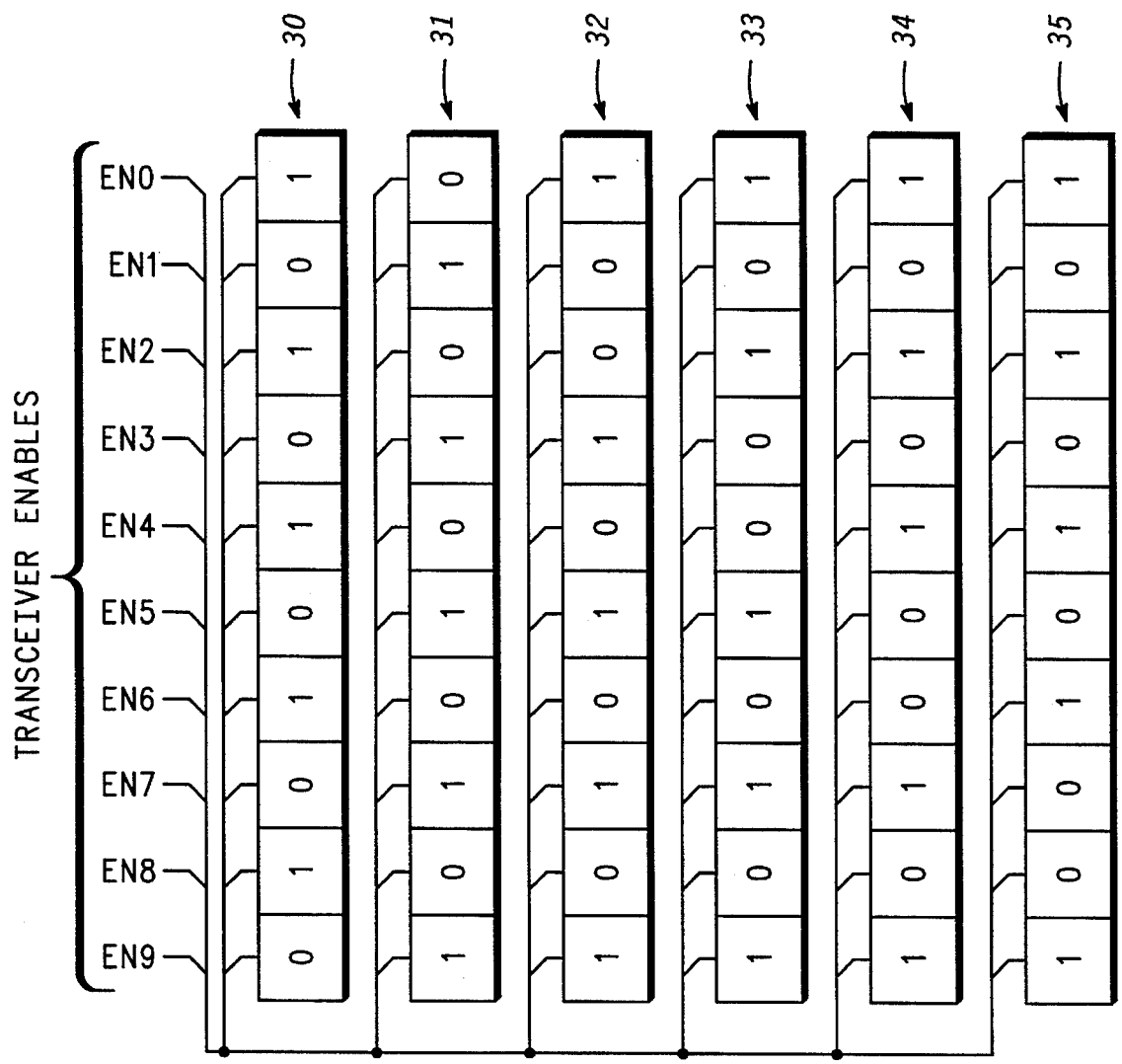
FIG. 7 is a block diagram of an alternate embodiment of the direction and enable decoding device of FIG. 4.

In a second implementation, computer 12 is a computer including a memory management unit (MMU) such as a 68040 as manufactured by Motorola, Inc. The MMU of computer 12 performs a function of automatically selecting appropriate addresses for memory access based upon a logical to physical assignment of actual memory addresses within the system. The MMU of computer 12 keeps within its memory a mapping of addresses selected by the computer to the appropriate addresses within the memory array 10. This logical to physical conversion is accomplished by the memory management unit of computer 12. Thus, the MMU requires a different register set in the direction and enable decoding 17. Refer to FIG. 7 for the register set 30 through 35 which comprises enable decoding 17 when an MMU implementation of the present invention is employed. The registers of FIG. 7 may be memory elements (readable and writable) or may be hard wired logic such as flip-flops or read only memory (ROM) programmable or not.

If no errors are detected, register 30 is used to direct the enables to the even numbered transceivers (0, 2, 4, 6, and 8). This is the normal operating condition of the system, that is, using register 30 to direct the enables to memory array 10. For the no faults condition, logical addresses 0 to 7FFFF map to physical addresses 0 to 7FFFF.

If the memory chip fault is located in the first column of memory chips, then register 31 is used to set the enable signal values. Register 31 includes a 0 for transceiver enable signal 0 which indicates that transceiver 0 is disabled. Reading then from right to left, transceiver enable signal 1 is enabled and each odd numbered transceiver enable signal and corresponding transceiver is enabled (1,3,5,7 and 9). If a faulty memory chip is detected in the first memory column of the memory array 10, MMU of computer 12 uses register 31 to generate the transceiver enable signals. Register 31 provides enable signals of the logic 1 for every odd enable (1, 3, 5, 7, and 9). Thus, MMU of computer 12 maps logical addresses 0 to 7FFFF to physical addresses and memory 80000 to FFFFF.

Similarly, if a faulty memory chip exists in column 2 of memory array 10, the values of the enable signals are shown by register 32. Transceivers 0, 3,5,7 and 9 are enabled. In addition, logical addresses 0 to 7FFFF are mapped by MMU to physical addresses 1000000 to 17FFFF as the appropriate physical address. If a defective memory chip exists in column three, the enable signal values are shown by register 33. Transceivers 0, 2, 5, 7 and 9 are enabled. Logical addresses 0 through 7FFFF are mapped by MMU to physical addresses 180000 through 1FFFFF. If a faulty memory chip is detected in column four, the enable values are as shown by register 34. Transceivers 0, 2, 4, 7 and 9 are enabled. Logical memory addresses 0 through 7FFFF are mapped by MMU to physical addresses 200000 through 27FFFF. If a memory fault is detected in column five, the enable signal values will be as shown in register 35. Transceivers 0, 2, 4, 6 and 9 are enabled. Logical memory addresses 0 through 7FFFF will be mapped by MMU to physical addresses 280000 through 2FFFFF. The mapping is accomplished by the memory management unit of computer 12. Further, it is assumed that for purposes of explanation, the memories are as arranged in FIGS.1 or 3 and are of size 128K by 8 bits.

The present memory system is a single fault tolerant column memory chip replacement system. That is, is cannot tolerate two memory chip failures within the same memory row.

As a result of the foregoing, a highly reliable memory system has been shown. The memory system includes improved column redundant memory for use by computers with or without memory management units. The column redundant memory replacement allows single-fault tolerant replacement of memory chips on a per row basis. That is, one memory chip may replace one faulty memory chip in each memory chip row. This provides a sizable reduction in the amount of memory required to provide replacement or spare memory for a column redundant memory arrangement. Such a minimal use of replacement memory will provide a smaller lighter weight computer system. In addition, the present memory arrangement provides a simpler hardware design and printed wiring card layout which provides the benefits of simpler address and data bussing arrangements.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A memory replacement arrangement for replacing faulty memory elements in a memory array and said memory array including M-rows X N-columns including one replacement column, an Nth column, of memory elements, said memory array including said replacement column of memory elements coupled to a computer via address and data buses, said memory replacement arrangement comprising:

transceiver means coupled between said computer and said memory array, said transceiver means for selectively coupling said memory elements of said memory array to said computer via said data bus;

enabling means coupled to said transceiver means and to said computer via said address bus, and for said faulty memory elements, said enabling means selectively replacing said faulty memory elements in different columns in each of said M-rows of said memory array enabling said transceiver means to couple a plurality of memory elements from said M-rows and from (N−1) columns of said different columns including at least one replacement memory element in a selectable column in any of said M-rows to said computer for transferring a selected computer word into or out of said memory array;

said enabling means including:
      address decoding means coupled to said computer via said address bus, said address decoding means generating a plurality of chip selects from an address transmitted from said computer, said chip selects enabling said M rows of memory elements of said memory array; and
      direction and enable decoding means coupled to said computer via said address bus, and to said memory array, said direction and enable decoding means producing a plurality of enable signals for selectively enabling said transceiver means to select (N−1) of said columns of memory elements of said different columns of memory elements including said plurality replacement memory elements.

2. A memory replacement arrangement as claimed in claim 1, wherein said transceiver means includes a plurality of transceivers coupled to said computer via said data bus and coupled to said memory array, each of said plurality of transceivers for coupling a predefined number of data bits between said computer and said memory array.

3. A memory replacement arrangement as claimed in claim 2, wherein said plurality of transceivers includes (2N−2) transceivers where N is a number of columns of said memory elements of said memory array, said data bus being segregated into a plurality of portions, each of said plurality of portions of said data bus being coupled to at least two transceivers of said plurality of transceivers.

4. A memory replacement arrangement as claimed in claim 3, wherein said at least two transceivers constitute a transceiver pair, at least one of said transceivers of said transceiver pair being cross-coupled to at least one of said transceivers of an adjacent transceiver pair, so that said data bus portion of said transceiver pair may be selectably coupled through one of said transceivers to a first memory element or coupled through another transceiver of said transceiver pair to a second memory element in an adjacent column to said first memory element and in the same row as said first memory element.

5. A memory replacement arrangement as claimed in claim 2, wherein each of said plurality of transceivers is coupled to said direction and enable decoding means via a unique one of a plurality of enable signal leads.

6. A memory replacement arrangement as claimed in claim 5, wherein:

said computer is further coupled to said direction and enable decoding means via a read/write signal; and said direction and enable decoding means producing a plurality of direction signals, each direction signal corresponding to an enable signal and being transmitted to one of said plurality of transceivers, said direction and enable decoding means being further coupled to said plurality of transceivers via a plurality of direction signal leads.

7. A memory replacement arrangement as claimed in claim 5, wherein said direction and enable decoding means includes a plurality of registers coupled to said computer and to each of said plurality of transceivers, each of plurality of registers corresponding to a distinct row of memory elements and including a number of bits equal to (2M−2), where M is a number of rows of said memory elements of said memory array.

8. A memory replacement arrangement as claimed in claim 7, wherein:

each of said registers includes a plurality of bits equal to (2N–2), where N is the numbers of columns of memory, and each of said bits corresponds to one of said plurality of transceivers and provides an enabling signal to said corresponding transceiver if a value of said corresponding bit is a first logic value and provides an inhibit signal if said logic value of said corresponding bit is a second logic value; and each of said bits of each of said registers being controlled by said computer in order to control which transceivers are being used for each row of memory elements to read and write data to said memory array.

* * * * *